(12) United States Patent
Mu et al.

(10) Patent No.: US 7,804,715 B2
(45) Date of Patent: Sep. 28, 2010

(54) BITCELL CURRENT SENSE DEVICE AND METHOD THEREOF

(75) Inventors: Hongtau Mu, Sunnyvale, CA (US); Nian Yang, Mountain View, CA (US); Fan Wan Lai, San Jose, CA (US); Guowei Wang, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 129 days.

(21) Appl. No.: 12/114,966

(22) Filed: May 5, 2008

(65) Prior Publication Data

US 2009/0273998 A1 Nov. 5, 2009

(51) Int. Cl.
*G11C 16/06* (2006.01)
(52) U.S. Cl. .............................. 365/185.2; 365/185.21; 365/208
(58) Field of Classification Search .................. 365/208, 365/185.2, 185.21
See application file for complete search history.

(56) References Cited

U.S. PATENT DOCUMENTS 7,136,305 B2 * 11/2006 Pagliato et al. ......... 365/185.21

* cited by examiner

*Primary Examiner*—Huan Hoang

(57) ABSTRACT

A memory device includes a sense amplifier to sense the state of a bitcell. The sense amplifier includes two input terminals connected via a switch. One of the input terminals is connected to a node, whereby a current through the node represents a difference in current drawn by a bitcell and a reference current. During a first phase, the switch between the input terminals of the sense amplifier is closed, so that a common voltage is applied to both input terminals. During a second phase, the switch is opened, and the sense amplifier senses a state of information stored at the bitcell based on the current through the node. By using the switch to connect and disconnect the inputs of the sense amplifier in the two phases, the accuracy and speed with which the state of the information stored at the bitcell can be determined is improved.

21 Claims, 7 Drawing Sheets

US 7,804,715 B2

BITCELL CURRENT SENSE DEVICE AND METHOD THEREOF

FIELD OF THE DISCLOSURE

The present disclosure relates to electronic devices and more particularly to memory devices.

BACKGROUND

Many integrated circuit devices employ memory devices to store data. The memory devices are typically composed of bit cells, with each bit cell storing one or more bits of data. In order to read the value of data stored at a bit cell, a signal generated by the bit cell in response to application of a read voltage is compared at a sense amplifier to a reference signal provided by a reference device. The reference device can include a transistor having similar characteristics as the bit cell transistor, allowing it to track the characteristics of the bit cell transistor.

As power specifications for memory devices have become more stringent, the range of signal magnitudes representing different logic states has grown smaller. In addition, the difference in magnitude between a signal representing a designated logic state and the signal generated by the reference cell has become smaller. Accordingly, it can be difficult for a sense amplifier in a conventional configuration to accurately sense a difference between the reference signal and the signal generated by the bitcell. Therefore, an improved device for sensing the state of a bitcell would be advantageous.

DESCRIPTION OF THE DRAWINGS

A memory device includes a sense amplifier to sense the state of a bitcell. The sense amplifier includes two input terminals connected via a switch. One of the input terminals is connected to a node, whereby a current through the node represents a difference in current drawn by a bitcell and a reference current. During a first phase, the switch between the input terminals of the sense amplifier is closed, so that a common voltage is applied to both input terminals. During a second phase, the switch is opened, and the sense amplifier senses a state of information stored at the bitcell based on the current through the node. By using the switch to connect and disconnect the inputs of the sense amplifier in the two phases, the accuracy and speed with which the state of the information stored at the bitcell can be determined is improved.

Figure 1:
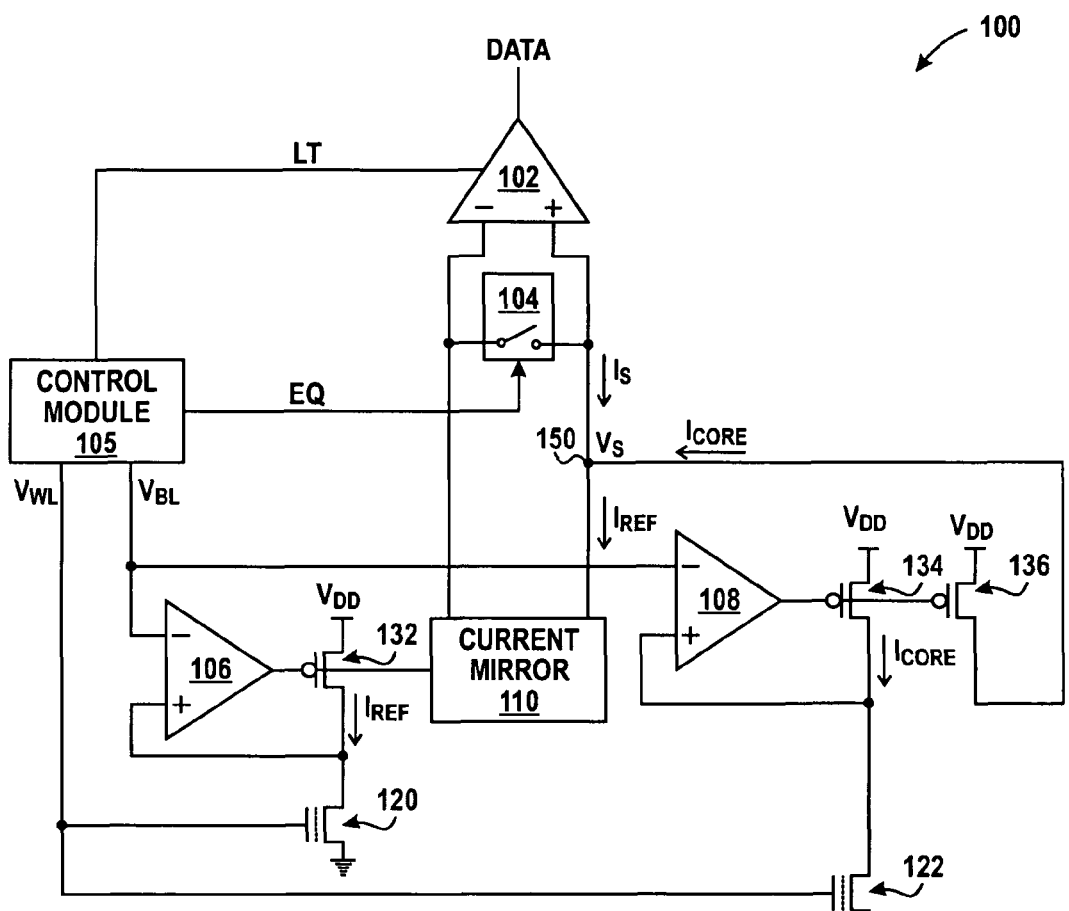
FIG. 1 is a combined block and circuit diagram of a memory device in accordance with one embodiment of the present disclosure.

Referring to FIG. 1, a combined block and circuit diagram of a particular embodiment of a memory device 100 is illustrated. The memory device 100 includes a sense amplifier 102, a switch 104, a control module 105, operational amplifiers 106 and 108, a current mirror 110, a reference bitcell 120, a memory bitcell 122, and p-type transistors 132, 134, and 136. The sense amplifier 102 includes a first input terminal, a second input terminal connected to a node 150, a control input to receive a signal labeled "LT", and an output terminal to provide a signal labeled "DATA." The switch 104 includes a first terminal connected to the first terminal of the sense amplifier 102, a second terminal connected to the second terminal of the sense amplifier 102, and a control input to receive a signal labeled "EQ."

The control module 105 includes a first output to provide the signal "LT", a second output to provide the signal "EQ", a third output to provide a voltage labeled "$V_{WL}$", and a fourth output to provide a voltage labeled "$V_{BL}$." The operational amplifier 106 includes a first input to receive the signal $V_{BL}$, a second input, and an output. The transistor 132 includes a first current electrode connected to a voltage reference labeled $V_{DD}$, a second current electrode connected to the second input of the operational amplifier 106, and a control electrode connected to the output of the operational amplifier 106. The reference bitcell 120 includes a first current electrode connected to the second current electrode of the transistor 132, a second current electrode coupled to a ground voltage reference, and a control electrode to receive the signal $V_{WL}$.

The operational amplifier 108 includes a first input to receive the signal $V_{BL}$, a second input, and an output. The transistor 134 includes a first current electrode connected to the $V_{DD}$ voltage reference, a second current electrode connected to the second input of the operational amplifier 108, and a control electrode connected to the output of the operational amplifier 108. The memory bitcell 122 includes a first current electrode connected to the second current electrode of the transistor 134, a second current electrode coupled to a ground voltage reference, and a control electrode to receive the signal $V_{WL}$. The transistor 136 includes a first current electrode coupled to the $V_{DD}$ voltage reference, a second current electrode coupled to the node 150, and a control electrode coupled to the output of the operational amplifier 108.

The current mirror 110 includes a first terminal connected to the output of the operational amplifier 106, a second terminal connected to the node 150, and a second terminal connected to the first input of the sense amplifier 102.

The memory bitcell 122 is configured as a storage device. As used herein, a memory bitcell refers to a device configured to store information representative of one or more logic states. For example, the memory bitcell 122 can be a floating gate bitcell, such as a flash memory bitcell, whereby information can be programmed into the bitcell by placing electrons on the floating gate, and can be erased by removing electrons from the floating gate. In the illustrated embodiment, the memory bitcell 122 is configured to draw a current, $I_{CORE}$, in response to assertion of the voltages $V_{BL}$ and $V_{WL}$ at a specified magnitude. The magnitude of the current $I_{CORE}$ will be based upon the logic state represented by the information stored at the memory bitcell 122. For example, if the memory bitcell 122 is in a programmed state, the current $I_{CORE}$ will be equal to a current designated, for purposes of discussion, as $I_{CORE-P}$.

Similarly, the memory bitcell 122 is in an erased state, the current $I_{CORE}$ will be equal to a current designate as $I_{CORE-E}$.

The reference bitcell 120 is configured as a reference device, whereby in response to assertion of the voltages $V_{BL}$ and $V_{WL}$ it draws a reference current $I_{REF}$. In particular, in the illustrated embodiment the reference bitcell 120 is a floating gate bitcell whose floating gate is preprogrammed such that the reference current $I_{REF}$ will be in a specified range. In an embodiment, the specified range of $I_{REF}$ is such that it is between the magnitudes of the currents $I_{CORE-P}$ and $I_{CORE-E}$. The reference current $I_{REF}$ thereby provides a current for comparison to $I_{CORE}$ such that the comparison indicates the logic state represented by the magnitude of $I_{CORE}$. In addition, the reference bitcell 120 is configured to be similar to the memory bitcell 122, such that variations in the current $I_{CORE}$ due to process and temperature variations are matched by corresponding variations in the current $I_{REF}$.

The transistor 134 and operational amplifier 108 are configured to apply the voltage $V_{BL}$ to the first current electrode of the bitcell 122. Accordingly, in response to assertion of the voltage $V_{BL}$ and $V_{WL}$ at specified magnitudes, the current $I_{CORE}$ is drawn through the second current electrode of the transistor 134. The transistor 136 is configured as a current mirror to transistor 134, so that the current $I_{CORE}$ is applied to the node 150.

The transistor 132 and operational amplifier 106 are configured to apply the voltage $V_{BL}$ to the first current electrode of the reference bitcell 120. Accordingly, in response to assertion of the voltage $V_{BL}$ and $V_{WL}$ at specified magnitudes, the current $I_{REF}$ is drawn through the second current electrode of the transistor 132. The current mirror 110 is configured to mirror the current $I_{REF}$ from the node 150. In addition, in the illustrated embodiment, the current mirror 110 is configured to generate a reference voltage $V_R$ for application to the first input of the sense amplifier 110. In other embodiments, discussed further with respect to FIGS. 5 and 6, the voltage $V_{BL}$ is applied to the first input of the sense amplifier 110 as a reference voltage.

The switch 104 is configured to be selectively placed in an opened or closed state, based on the state of the signal EQ. In particular, in response to assertion of the EQ signal, the switch 104 is placed in a closed state, connecting the inputs of the sense amplifier 102, while in response to negation of the signal EQ, switch 104 is opened to disconnect the inputs.

The sense amplifier 102 is configured to, in response to assertion of the LT signal, sense a difference between voltages at the first and second inputs and to set the state of the signal DATA based on the sensed difference. In an embodiment, the output of the sense amplifier 102 is connected to a latch (not shown), so that the state of the signal DATA can be stored for subsequent access.

The control module 105 is configured to control the magnitude of the voltages $V_{BL}$ and $V_{WL}$ and the signals EQ and LT, to read information stored at the memory bitcell 122. The operation of the control module 105 and the memory device 100 can be better understood with reference to FIG. 2, which illustrates a particular embodiment of signal waveforms 200 associated with the memory device 100 of FIG. 1. In the illustrated embodiment, waveform 202 represents the voltage $V_{WL}$, waveform 204 represents the voltage $V_{BL}$, waveform 206 represents the signal EQ, waveform 208 represents the voltage $V_S$, waveform 210 represents the signal LT, and waveform 212 represents the signal DATA.

Figure 2:
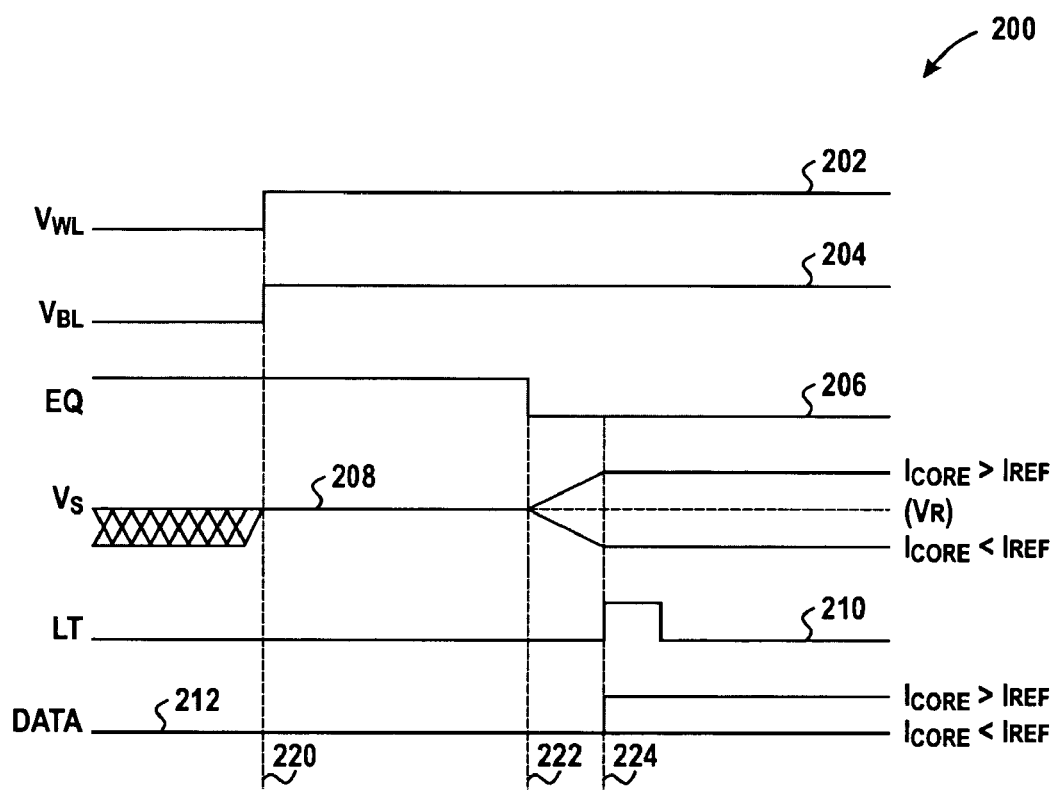
FIG. 2 is a diagram illustrating a particular embodiment of signal waveforms associated with the memory device of FIG. 1.

In the embodiment illustrated in FIG. 2, at time 220 the control module 105 sets the voltages $V_{BL}$ and $V_{WL}$ at a sufficient level to read the information stored at the bitcell 122. This causes the magnitude of the current $I_{CORE}$ to be representative of the logic state stored bitcell 122, and causes the magnitude of the current $I_{REF}$ to be placed in the specified reference range. In addition, at time 220, the EQ signal is asserted, so that the inputs of the sense amplifier 102 are connected. This in turn causes the magnitude of the voltage at the node 150, labeled "$V_S$", to be set at or near the level of the voltage $V_R$.

At time 222, the signal EQ is negated. The time period between time 220 and 222 corresponds to a precharge phase for the memory device 100. In particular, this time period is provided to ensure that the currents $I_{CORE}$ and $I_{REF}$ have reached a relatively steady state so that the information stored at the memory bitcell 122 can be accurately read. In response to the signal EQ being negated, the switch 104 is opened and the inputs of the sense amplifier 102 are thereby disconnected. This disconnects node 150 from the voltage $V_R$, so that the voltage $V_S$ becomes dependent on the difference between the currents $I_{REF}$ and $I_{CORE}$. This difference is illustrated as the current $I_S$ in FIG. 1. Accordingly, in response to negation of the signal EQ, the magnitude of the voltage $V_S$ changes to a level dependent on $I_S$. In the illustrated example of FIG. 2, if $I_{CORE}$ is greater than $I_{REF}$, indicating a logic high value is stored at the memory bitcell 122, the magnitude of the voltage $V_S$ increases to above the magnitude of $V_R$. In contrast, if $I_{CORE}$ is less than $I_{REF}$, indicating a logic low value is stored at the memory bitcell 122, the magnitude of the voltage $V_S$ decreases to below the magnitude of $V_R$.

At time 224, the control module 105 asserts the signal LT, causing the sense amplifier to sense the difference between the voltages $V_S$ and $V_R$, and provide an indication of the difference via the signal DATA. Thus, as illustrated, in response to determining that $V_S$ is greater than the $V_R$, the sense amplifier 102 provides a voltage representative of a first logic state via the DATA signal, while in response to determining that $V_S$ is less than $V_R$, the sense amplifier 104 provides a voltage indicative of a second logic state via the DATA signal. The state of the DATA signal thereby represents the information stored at the memory bitcell 122.

In the illustrated embodiment of FIG. 2, by connecting the inputs of the sense amplifier together during the precharge phase the likelihood that noise will impact operation of the sense amplifier 102 is reduced. In particular, absent connecting the inputs, an integration effect can take place whereby noise at the inputs of the sense amplifier 102 can contribute to the voltages read at the amplifier in response to assertion of the LT signal. The presence of sufficient noise can thereby cause an erroneous comparison of the voltages at the inputs of the sense amplifier 102, in turn causing an erroneous sensing of the information stored at the memory bitcell 122. Connecting the inputs of the sense amplifier 102 during the precharge phase reduces the integration effect, thereby reducing the likelihood of an erroneous sensing.

In addition, connecting the inputs of the sense amplifier 102 during the precharge phase allows both inputs to quickly reach a nominal level ($V_R$). Absent connection of the inputs, each input must individually reach a specified level before comparison by the sense amplifier 102. Connecting the inputs via the switch 104 during the precharge phase allows each input to reach the nominal level more quickly, allowing the information stored at the memory bitcell 122 to be determined more rapidly.

Figure 3:
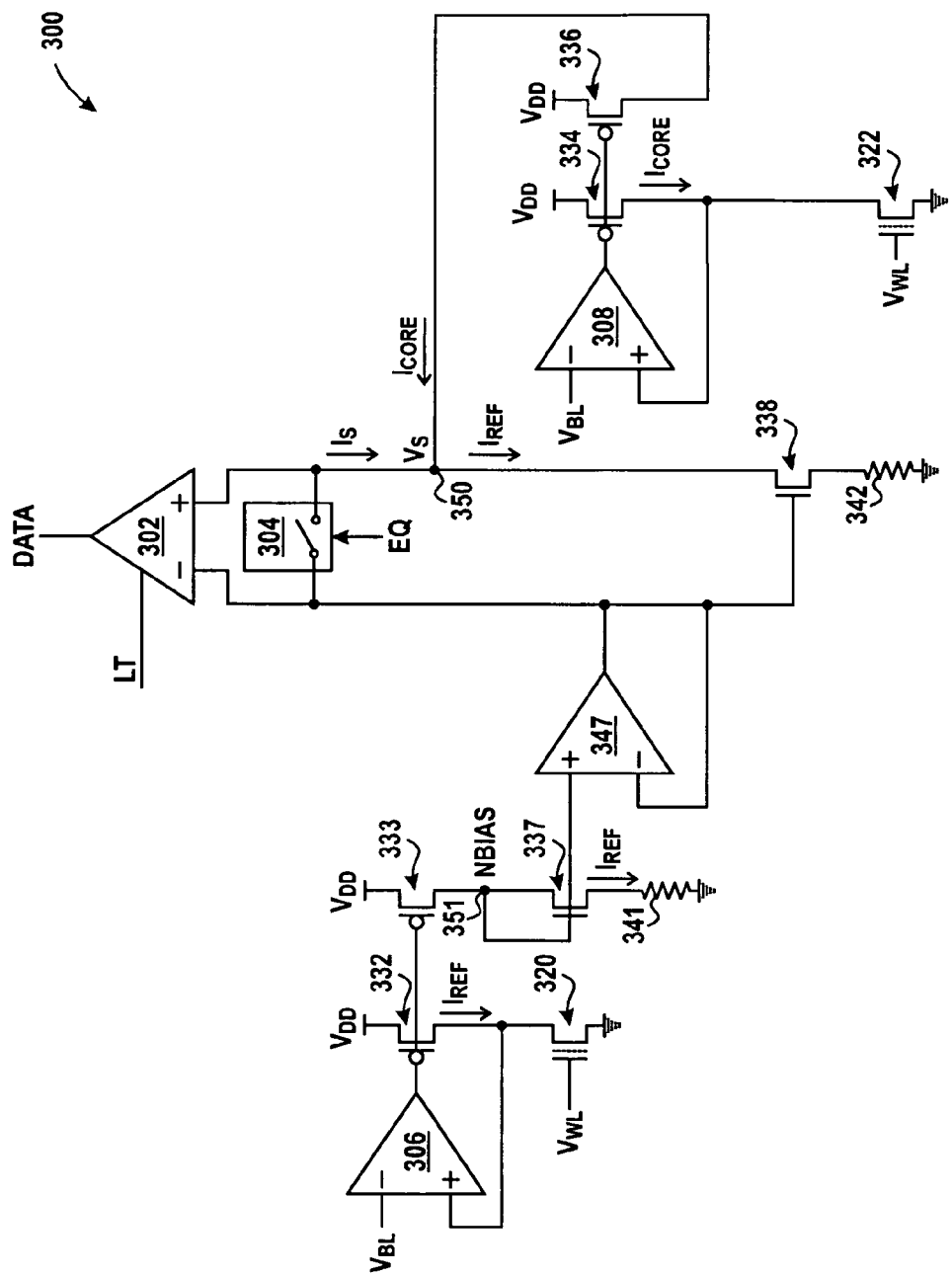
FIG. 3 is a combined block and circuit diagram of a particular embodiment of the memory device of FIG. 1.

FIG. 3 illustrates a circuit diagram of a particular embodiment of a memory device 300, corresponding to the memory device 100 of FIG. 1. The memory device 300 includes a sense amplifier 302, a switch 304, operational amplifiers 306, 308, and 347, reference bitcell 320, and memory bitcell 322.

In addition, the memory device 300 includes transistors 332, 333, 334, 336, 337, and 338, as well as resistors 341 and 342. The sense amplifier 302 includes a first input terminal, a second input terminal connected to a node 350, a control input to receive the signal LT, and an output terminal to provide the signal DATA. The switch 304 includes a first terminal connected to the first terminal of the sense amplifier 302, a second terminal connected to the second terminal of the sense amplifier 302, and a control input to receive the signal EQ.

The operational amplifier 306 includes a first input to receive the signal $V_{BL}$, a second input, and an output. The transistor 332 include a first current electrode connected to the $V_{DD}$ voltage reference, a second current electrode connected to the second input of the operational amplifier 306, and a control electrode connected to the output of the operational amplifier 306. The reference bitcell 320 includes a first current electrode connected to the second current electrode of the transistor 332, a second current electrode coupled to a ground voltage reference, and a control electrode to receive the signal $V_{WL}$. The transistor 333 includes a first current electrode coupled to the $V_{DD}$ voltage reference, a second current electrode, and a control electrode coupled to the output of the operational amplifier 306. The transistor 337 includes a first current electrode connected to the second current electrode of the transistor 333, a second current electrode, and a control electrode connected to the first current electrode. The resistor 341 includes a first terminal connected to the second current electrode of the transistor 337 and a second terminal connected to the ground reference voltage.

The operational amplifier 347 includes a first input connected to first current electrode of the transistor 337, a second input, and an output connected to the second input, and connected to the first input of the sense amplifier 302. The transistor 338 includes a first current electrode connected to the node 350, a second current electrode, and a control electrode connected to the output of the operational amplifier 347. The resistor 342 includes a first terminal connected to the second current electrode of the transistor 338 and a second terminal connected to the ground voltage reference.

The operational amplifier 308 includes a first input to receive the signal $V_{BL}$, a second input, and an output. The transistor 334 include a first current electrode connected to the $V_{DD}$ voltage reference, a second current electrode connected to the second input of the operational amplifier 308, and a control electrode connected to the output of the operational amplifier 308. The memory bitcell 322 includes a first current electrode connected to the second current electrode of the transistor 334, a second current electrode coupled to a ground voltage reference, and a control electrode to receive the signal $V_{WL}$. The transistor 336 includes a first current electrode coupled to the $V_{DD}$ voltage reference, a second current electrode coupled to the node 350, and a control electrode coupled to the output of the operational amplifier 308.

In operation, the operational amplifier 306, transistors 332, and reference bitcell 320 are configured to generate the reference current $I_{REF}$ in a similar fashion to the corresponding elements of FIG. 1. The transistors 333 and 337 are configured to mirror the current $I_{REF}$ so that the current is drawn through the resistor 341. The operational amplifier 347 is configured as a buffer to drive the first input of the sense amplifier 302, as well as the transistor 338, such that the current $I_{REF}$ is drawn through the transistor 338 and the resistor 342, away from node 350.

In addition, the transistor 337 is connected in a diode configuration, such that the a relatively stable voltage, NBIAS, is generated at the node 351. The operational amplifier 347 provides the voltage at the node 351 to the first input of the sense amplifier 302, so that $V_R$ is substantially the same as NBIAS. Thus, the configuration of the transistor 337 and the operational amplifier 347 provides a relatively stable reference voltage to the first input of the sense amplifier 302.

The transistors 334 and 336, together with the operational amplifier 308 and the memory bitcell 322, are configured to generate the current $I_{CORE}$ in similar fashion to the corresponding elements of FIG. 1. The state of the memory bitcell 322 is determined based on the currents $I_{REF}$ and $I_{CORE}$ as described above with respect to FIG. 2. In addition, the provision of the relatively stable voltage $V_R$ to the first input of the sense amplifier allows for accurate and fast determination of the information stored at the bitcell 322.

Figure 4:
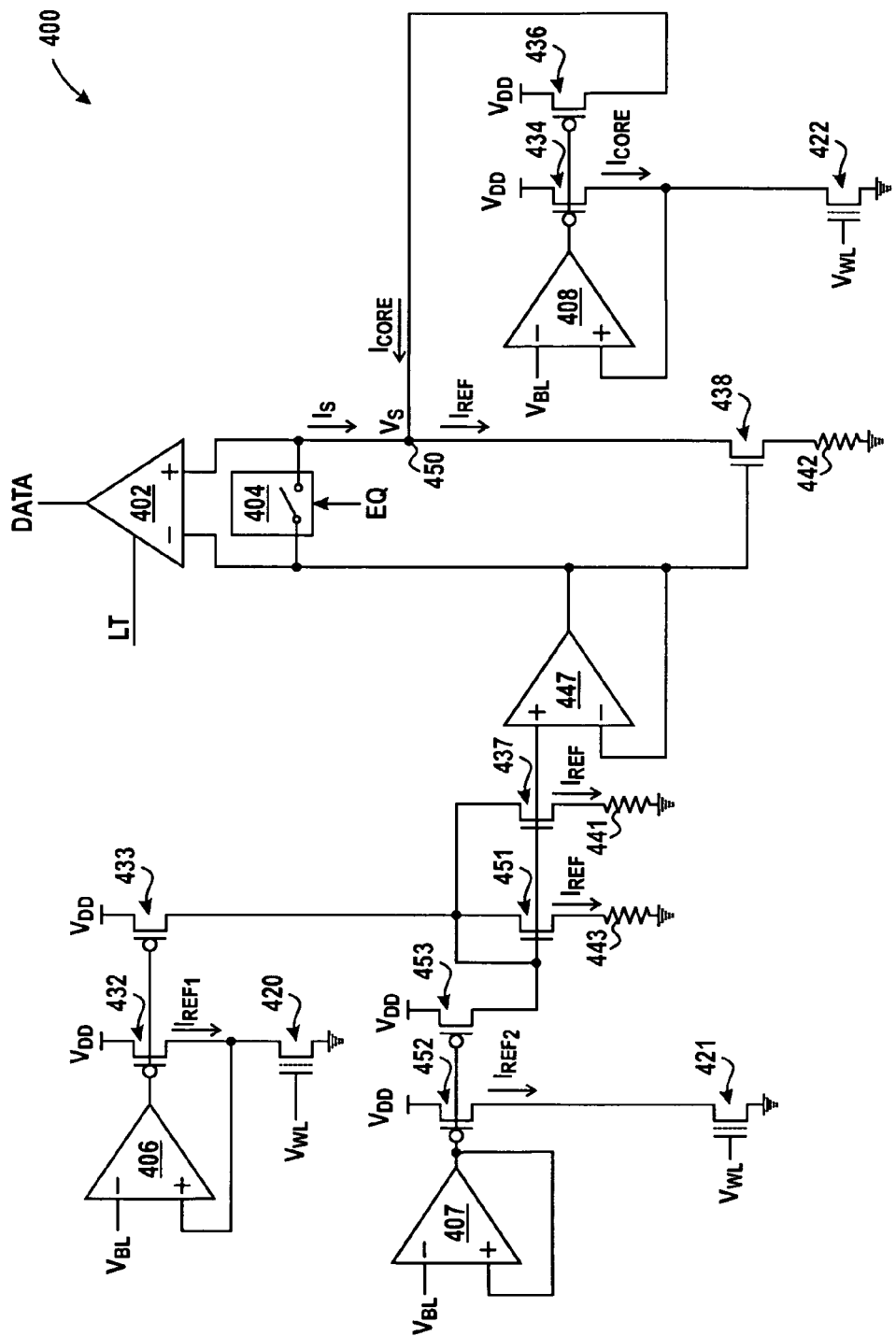
FIG. 4 is a combined block and circuit diagram of a memory device in accordance with one embodiment of the present disclosure.

FIG. 4 illustrates a circuit diagram of a particular embodiment of a memory device 400. The memory device 400 includes a sense amplifier 402, a switch 404, operational amplifiers 406, 407, 408, and 447, reference bitcells 420 and 421, and memory bitcell 422. In addition, the memory device 400 includes transistors 432, 433, 434, 436, 437, 438, 451, 452, and 453, as well as resistors 441, 442, and 443. The sense amplifier 402 includes a first input terminal, a second input terminal connected to a node 450, a control input to receive the signal LT, and an output terminal to provide the signal DATA. The switch 404 includes a first terminal connected to the first terminal of the sense amplifier 402, a second terminal connected to the second terminal of the sense amplifier 402, and a control input to receive the signal EQ.

The operational amplifier 406 includes a first input to receive the signal $V_{BL}$, a second input, and an output. The transistor 432 include a first current electrode connected to the $V_{DD}$ voltage reference, a second current electrode connected to the second input of the operational amplifier 406, and a control electrode connected to the output of the operational amplifier 406. The reference bitcell 420 includes a first current electrode connected to the second current electrode of the transistor 432, a second current electrode coupled to a ground voltage reference, and a control electrode to receive the signal $V_{WL}$. The transistor 433 includes a first current electrode coupled to the $V_{DD}$ voltage reference, a second current electrode, and a control electrode coupled to the output of the operational amplifier 406. The transistor 437 includes a first current electrode connected to the second current electrode of the transistor 433, a second current electrode, and a control electrode connected to the first current electrode. The resistor 441 includes a first terminal connected to the second current electrode of the transistor 437 and a second terminal connected to the ground reference voltage.

The operational amplifier 407 includes a first input to receive the signal $V_{BL}$, a second input, and an output. The transistor 452 include a first current electrode connected to the $V_{DD}$ voltage reference, a second current electrode connected to the second input of the operational amplifier 407, and a control electrode connected to the output of the operational amplifier 407. The reference bitcell 421 includes a first current electrode connected to the second current electrode of the transistor 452, a second current electrode coupled to a ground voltage reference, and a control electrode to receive the signal $V_{WL}$. The transistor 453 includes a first current electrode coupled to the $V_{DD}$ voltage reference, a second current electrode, and a control electrode coupled to the output of the operational amplifier 407. The transistor 451 includes a first current electrode connected to the second current electrode of the transistor 433, and connected to the first current electrode of the transistor 437. The transistor 451 also includes a second current electrode, and a control electrode connected to the first current electrode of the transistor 451. The resistor 443 includes a first terminal connected to the second current electrode of the transistor 451 and a second terminal connected to the ground reference voltage.

The operational amplifier 447 includes a first input connected to first current electrode of the transistor 437, a second input, and an output connected to the second input, and connected to the first input of the sense amplifier 402. The transistor 438 includes a first current electrode connected to the node 450, a second current electrode, and a control electrode connected to the output of the operational amplifier 447. The resistor 442 includes a first terminal connected to the second current electrode of the transistor 438 and a second terminal connected to the ground voltage reference.

The operational amplifier 408 includes a first input to receive the signal $V_{BL}$, a second input, and an output. The transistor 434 include a first current electrode connected to the $V_{DD}$ voltage reference, a second current electrode connected to the second input of the operational amplifier 408, and a control electrode connected to the output of the operational amplifier 408. The memory bitcell 422 includes a first current electrode connected to the second current electrode of the transistor 434, a second current electrode coupled to a ground voltage reference, and a control electrode to receive the signal $V_{WL}$. The transistor 436 includes a first current electrode coupled to the $V_{DD}$ voltage reference, a second current electrode coupled to the node 450, and a control electrode coupled to the output of the operational amplifier 408.

The memory device 400 is arranged similarly to the memory device 300, and in operation determines the information stored at the bitcell 422 in a similar fashion. However, as illustrated the memory device 400 employs two different reference bitcells, bitcells 420 and 421, to generate a reference current. In particular, the reference bitcell 420 generates a current $I_{REF}$, and reference bitcell 421 generates a current $I_{REF2}$ in response to the voltage $V_{BL}$ and $V_{WL}$ being placed at a specified magnitude to read the information stored at the memory bitcell 422. The configuration of the transistors 437 and 451 cause the current $I_{REF}$, representing an average of the currents $I_{REF1}$ and $I_{REF2}$, to be drawn through each of the resistors 441 and 443. The current $I_{REF}$ is mirrored through the resistor 442 by the operational amplifier 447 and transistor 438. The information stored at the bitcell 422 is determined based on the voltage $V_S$, as described above with respect to FIG. 2, and the voltage $V_S$ is in turn based on the relationship between $I_{REF}$ and $I_{CORE}$. Thus, the memory device 400 determines the information stored at the bitcell 422 by effectively comparing the current $I_{CORE}$ with a reference current generated by multiple reference bitcells. The use of multiple reference bitcells reduces the likelihood that errors or process variations in a single reference bitcell will cause erroneous determinations of the information stored at the bitcell 422.

Figure 5:
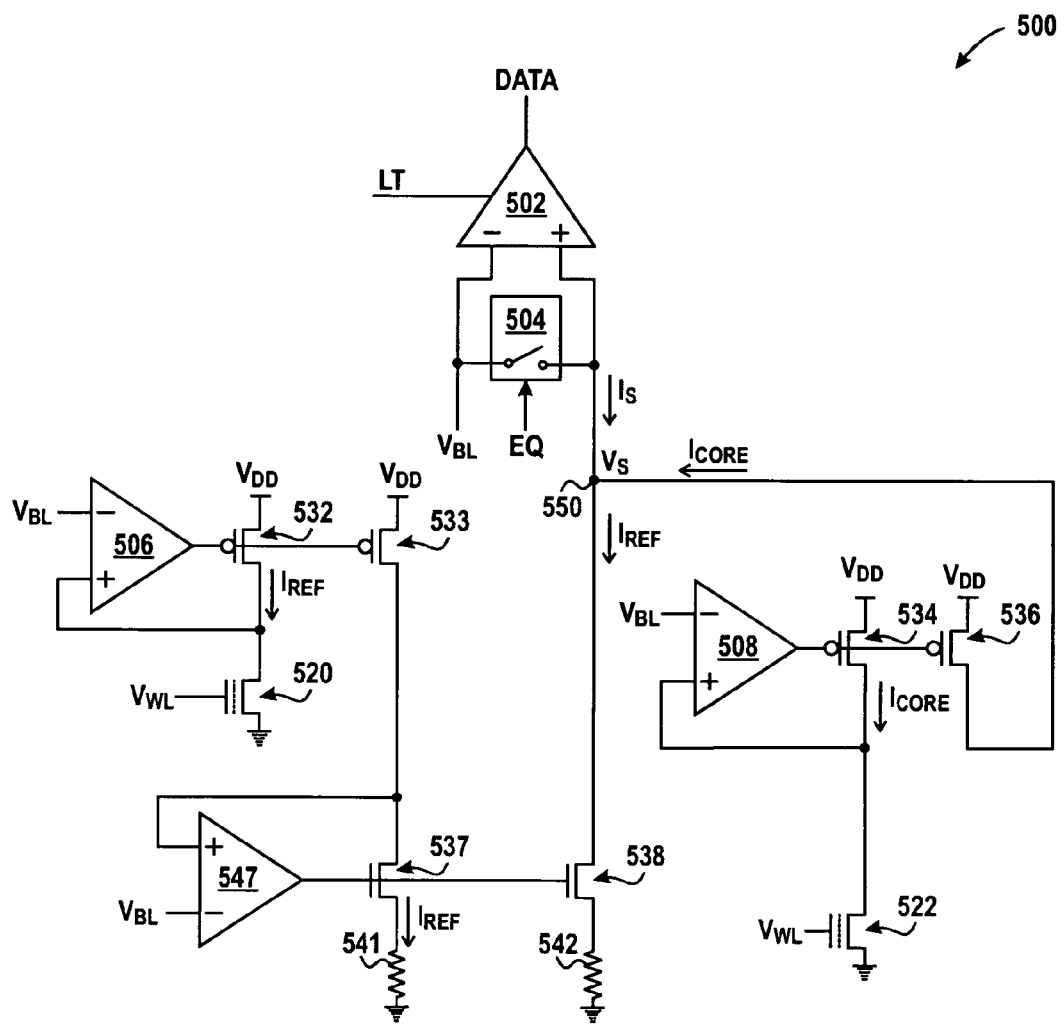
FIG. 5 is a combined block and circuit diagram of a memory device in accordance with an alternative embodiment of the present disclosure.

FIG. 5 illustrates a circuit diagram of a particular embodiment of a memory device 500. The memory device 500 includes a sense amplifier 502, a switch 504, operational amplifiers 506, 508, and 547, reference bitcell 520, and memory bitcell 522. In addition, the memory device 500 includes transistors 532, 533, 534, 536, 537, and 538, as well as resistors 541 and 542. The sense amplifier 502 includes a first input terminal configured to receive the voltage $V_{BL}$, a second input terminal connected to a node 550, a control input to receive the signal LT, and an output terminal to provide the signal DATA. The switch 504 includes a first terminal connected to the first terminal of the sense amplifier 502, a second terminal connected to the second terminal of the sense amplifier 502, and a control input to receive the signal EQ.

The operational amplifier 506 includes a first input to receive the signal $V_{BL}$, a second input, and an output. The transistor 532 include a first current electrode connected to the $V_{DD}$ voltage reference, a second current electrode connected to the second input of the operational amplifier 506, and a control electrode connected to the output of the operational amplifier 506. The reference bitcell 520 includes a first current electrode connected to the second current electrode of the transistor 532, a second current electrode coupled to a ground voltage reference, and a control electrode to receive the signal $V_{WL}$. The transistor 533 includes a first current electrode coupled to the $V_{DD}$ voltage reference, a second current electrode, and a control electrode coupled to the output of the operational amplifier 506. The transistor 537 includes a first current electrode connected to the second current electrode of the transistor 533, a second current electrode, and a control electrode. The resistor 541 includes a first terminal connected to the second current electrode of the transistor 537 and a second terminal connected to the ground reference voltage. The operational amplifier 547 includes a first input configured to receive the voltage $V_{BL}$, a second input connected to the first current electrode of the transistor 537, and an output connected to the control electrode of the transistor 537.

The transistor 538 includes a first current electrode connected to the node 550, a second current electrode, and a control electrode connected to the output of the operational amplifier 547. The resistor 542 includes a first terminal connected to the second current electrode of the transistor 538 and a second terminal connected to the ground voltage reference.

The operational amplifier 508 includes a first input to receive the signal $V_{BL}$, a second input, and an output. The transistor 534 include a first current electrode connected to the $V_{DD}$ voltage reference, a second current electrode connected to the second input of the operational amplifier 508, and a control electrode connected to the output of the operational amplifier 508. The memory bitcell 522 includes a first current electrode connected to the second current electrode of the transistor 534, a second current electrode coupled to a ground voltage reference, and a control electrode to receive the signal $V_{WL}$. The transistor 536 includes a first current electrode coupled to the $V_{DD}$ voltage reference, a second current electrode coupled to the node 550, and a control electrode coupled to the output of the operational amplifier 508.

In operation, the memory device 500 determines the information stored at the bitcell 522 in similar fashion as described above with respect to FIG. 2. However, instead of generating a reference voltage for the sense amplifier 502 with a current mirror, the memory device 500 uses the voltage $V_{BL}$ as the reference voltage. Using $V_{BL}$ as the reference voltage can be useful in applications where a diode connected transistor, such as transistor 337 of FIG. 3, does not generate a reference voltage at a sufficient level.

In particular, in the illustrated embodiment of FIG. 5, the voltage $V_{BL}$ is directly applied to the first input of the sense amplifier 502. In addition, the voltage $V_{BL}$ is applied to the second input of the operational amplifier 547, which in conjunction with the transistors 537 and 538 and the resistors 541 and 542, mirrors the current $I_{REF}$ so that the current is drawn from node 550 through resistor 542.

Figure 6:
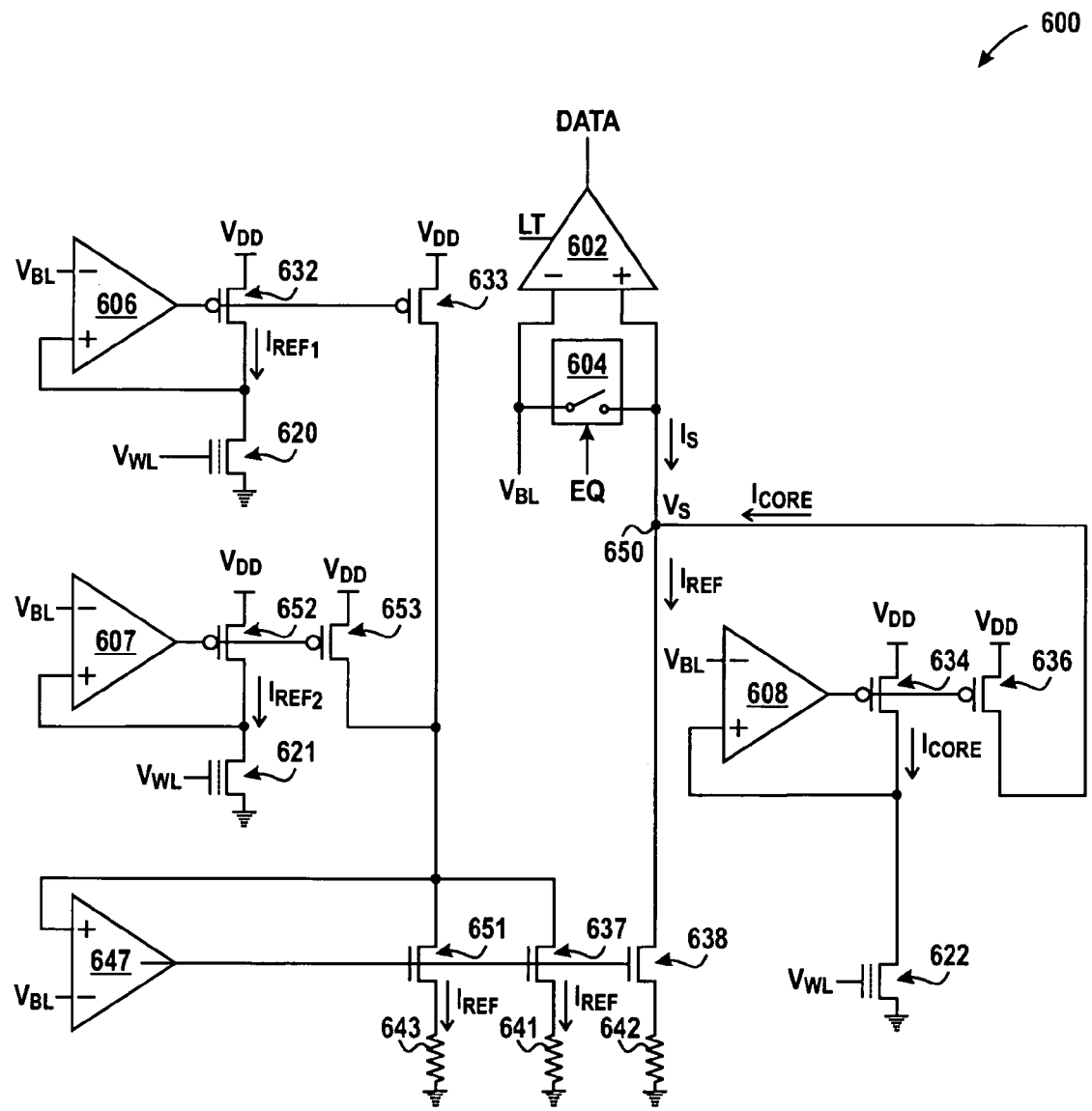
FIG. 6 is a combined block and circuit diagram of a memory device in accordance with another embodiment of the present disclosure.

FIG. 6 illustrates a circuit diagram of a particular embodiment of a memory device 600. The memory device 600 includes a sense amplifier 502, a switch 504, operational amplifiers 606, 607, 608, and 647, reference bitcells 620 and 621, and memory bitcell 622. In addition, the memory device 600 includes transistors 632, 633, 634, 636, 637, 638, 651, 652, and 653, as well as resistors 641, 642, and 643. The sense amplifier 602 includes a first input terminal configured to receive the voltage $V_{BL}$, a second input terminal connected to a node 650, a control input to receive the signal LT, and an output terminal to provide the signal DATA. The switch 604 includes a first terminal connected to the first terminal of the sense amplifier 602, a second terminal connected to the second terminal of the sense amplifier 602, and a control input to receive the signal EQ.

The operational amplifier 606 includes a first input to receive the signal $V_{BL}$, a second input, and an output. The transistor 632 includes a first current electrode connected to the $V_{DD}$ voltage reference, a second current electrode connected to the second input of the operational amplifier 606, and a control electrode connected to the output of the operational amplifier 606. The reference bitcell 620 includes a first current electrode connected to the second current electrode of the transistor 632, a second current electrode coupled to a ground voltage reference, and a control electrode to receive the signal $V_{WL}$. The transistor 633 includes a first current electrode coupled to the $V_{DD}$ voltage reference, a second current electrode, and a control electrode coupled to the output of the operational amplifier 606. The transistor 637 includes a first current electrode connected to the second current electrode of the transistor 533, a second current electrode, and a control electrode. The resistor 641 includes a first terminal connected to the second current electrode of the transistor 637 and a second terminal connected to the ground reference voltage.

The operational amplifier 607 includes a first input to receive the signal $V_{BL}$, a second input, and an output. The transistor 652 includes a first current electrode connected to the $V_{DD}$ voltage reference, a second current electrode connected to the second input of the operational amplifier 607, and a control electrode connected to the output of the operational amplifier 607. The reference bitcell 621 includes a first current electrode connected to the second current electrode of the transistor 652, a second current electrode coupled to a ground voltage reference, and a control electrode to receive the signal $V_{WL}$. The transistor 653 includes a first current electrode coupled to the $V_{DD}$ voltage reference, a second current electrode, and a control electrode coupled to the output of the operational amplifier 607. The transistor 651 includes a first current electrode connected to the second current electrode of the transistor 653 and connected to the first current electrode of the transistor 637. The transistor 651 also includes a second current electrode, and a control electrode. The resistor 643 includes a first terminal connected to the second current electrode of the transistor 651 and a second terminal connected to the ground reference voltage.

The operational amplifier 647 includes a first input configured to receive the voltage $V_{BL}$, a second input connected to the first current electrode of the transistor 637, and an output connected to the control electrode of the transistor 537 and the control electrode of the transistor 651. The transistor 638 includes a first current electrode connected to the node 650, a second current electrode, and a control electrode connected to the output of the operational amplifier 647. The resistor 642 includes a first terminal connected to the second current electrode of the transistor 638 and a second terminal connected to the ground voltage reference.

The operational amplifier 608 includes a first input to receive the signal $V_{BL}$, a second input, and an output. The transistor 634 include a first current electrode connected to the $V_{DD}$ voltage reference, a second current electrode connected to the second input of the operational amplifier 608, and a control electrode connected to the output of the operational amplifier 608. The memory bitcell 622 includes a first current electrode connected to the second current electrode of the transistor 634, a second current electrode coupled to a ground voltage reference, and a control electrode to receive the signal $V_{WL}$. The transistor 636 includes a first current electrode coupled to the $V_{DD}$ voltage reference, a second current electrode coupled to the node 650, and a control electrode coupled to the output of the operational amplifier 608.

The memory device 600 is arranged similarly to the memory device 500, and in operation determines the information stored at the bitcell 622 in a similar fashion. However, as illustrated the memory device 600 employs two different reference bitcells, bitcells 620 and 621, to generate currents $I_{REF1}$ and $I_{REF2}$, respectively in response to the voltage $V_{BL}$ and $V_{WL}$ being placed at a specified magnitude to read the information stored at the memory bitcell 622. The configuration of the transistors 637 and 651 cause the current $I_{REF}$, representing an average of the currents $I_{REF1}$ and $I_{REF2}$, to be drawn through the resistors 641 and 643. The current $I_{REF}$ is mirrored through the resistor 642 by the operational amplifier 647 and transistor 638. The information stored at the bitcell 622 is determined based on the voltage $V_S$, as described above with respect to FIG. 2, and the voltage $V_S$ is in turn based on the relationship between $I_{REF}$ and $I_{CORE}$. Thus, the memory device 600 determines the information stored at the bitcell 622 by effectively comparing the current $I_{CORE}$ with a reference current generated by multiple reference bitcells.

Figure 7:
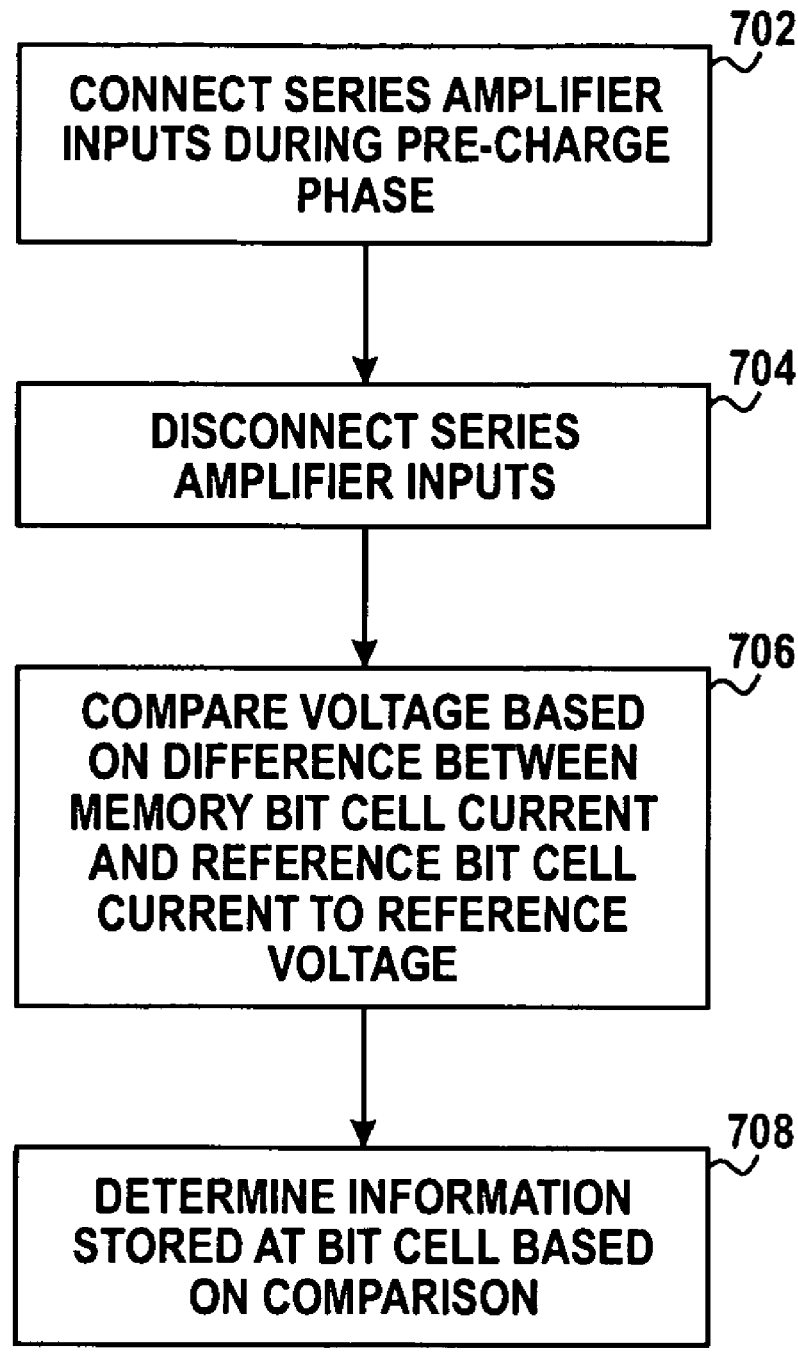
FIG. 7 is a flow diagram of a method of sensing the state of a bitcell in accordance with one embodiment of the present disclosure.

Referring to FIG. 7, a flow diagram of a particular embodiment of a method of determining information stored at a memory bitcell is illustrated. At block 702, the input terminals are connected together during a precharge phase of the memory bitcell. This allows the input terminals to reach a common voltage. At block 704, the sense amplifier inputs are disconnected from each other. In an embodiment, the disconnection takes place after the precharge phase.

At block 706, a voltage based on a difference between a current drawn by the memory bitcell and a current drawn by a reference bitcell is compared to a reference voltage. At block 708, information stored by the bitcell is determined based on the comparison of the voltages at block 706.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of the invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

After reading the specification, skilled artisans will appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, references to values stated in ranges include each and every value within that range.

What is claimed is:

1. A device, comprising:
a first bitcell comprising a first terminal configured to allow a first current at the first terminal during a read cycle, the first current representative of information stored at the first bitcell;
a second bitcell comprising a second terminal configured to allow a second current at the second terminal, the second current representative of a first reference current;
a first node coupled to the first terminal of the first bitcell and the second terminal of the second bitcell;
a sense amplifier comprising a first input coupled to the first node and a second input configured to receive a voltage; and
a switch comprising a first terminal coupled to the first input of the sense amplifier, a second terminal coupled to the second input of the sense amplifier, and a control input, a voltage at the first node based on the first current and the second current when the switch is open.

2. The device of claim 1, wherein the control input of the switch is configured to receive a control signal, the control signal configured to close the switch during a first phase of the read cycle, and open the switch during a second phase of the read cycle.

3. The device of claim 2, wherein the first phase corresponds to a precharge phase of the read cycle, and the second phase corresponds to a read phase of the read cycle.

4. The device of claim 1, further comprising a current mirror coupled between the first terminal of the first bitcell and the first node.

5. The device of claim 4, wherein the current mirror comprises:
an operational amplifier comprising an input configured to be charged to a bitline voltage associated with a bitline of the first bitcell, a second input coupled to the output of the first bitcell, and an output;
a first transistor comprising a first current electrode coupled to a first voltage reference, a second current electrode coupled to the first terminal of the first bitcell, and a control electrode coupled to the output of the operational amplifier;
a second transistor comprising a first current electrode coupled to the first voltage reference, a second current electrode coupled to the first node, and a control electrode coupled to the output of the operational amplifier.

6. The device of claim 1, further comprising:
a current mirror coupled between the second terminal of the second bitcell and the first node.

7. The device of claim 6, wherein the current mirror comprises:
a first operational amplifier comprising an input configured to receive a bitline voltage associated with a bitline of the second bitcell, a second input coupled to the output of the second bitcell, and an output;
a first transistor comprising a first current electrode coupled to a first voltage reference, a second current electrode coupled to the second terminal of the second bitcell, and a control electrode coupled to the output of the first operational amplifier; and
a second transistor comprising a first current electrode coupled to the first voltage reference, a second current electrode coupled to the first node, and a control electrode coupled to the output of the first operational amplifier.

8. The device of claim 7, wherein the second current mirror further comprises:
a third transistor comprising a first current electrode coupled to the second current electrode of the second transistor, a second current electrode coupled to a second voltage reference, and a control electrode coupled to the first current electrode of the third transistor.

9. The device of claim 8, wherein the second current mirror further comprises:
a first resistor coupled between the second current electrode of the third transistor and the second voltage reference.

10. The device of claim 9, wherein the second current mirror further comprises:
a second operational amplifier coupled between the second current electrode of the second transistor and the first node, the second operational amplifier comprising a first input coupled to the second current electrode of the second transistor, a second input coupled to first node, and an output coupled to the second input.

11. The device of claim 10, wherein the current mirror further comprises:
a fourth transistor coupled between the second input of the second operational amplifier and the first node, the fourth transistor comprising a first current electrode coupled to the first node, a second current electrode coupled to the second voltage reference, and a control electrode coupled to the second input of the second operational amplifier.

12. The device of claim 11, wherein the second input of the sense amplifier is coupled to the output of the second operational amplifier.

13. The device of claim 11, further comprising a second resistor coupled between the second current electrode of the fourth transistor and the second voltage reference.

14. The device of claim 7, wherein the current mirror further comprises:
a second operational amplifier coupled between the second current electrode of the second transistor and the first node, the second operational amplifier comprising a first input coupled to the second current electrode of the second transistor, a second input configured to receive the bitline voltage, and an output coupled to the first node.

15. The device of claim 14, wherein the second input of the sense amplifier is configured to receive the bitline voltage.

16. The device of claim 14, wherein the current mirror further comprises:
a third transistor comprising a first current electrode coupled to the second current electrode of the second transistor, a second current electrode coupled to a second voltage reference, and a control electrode coupled to the output of the second operational amplifier; and
a fourth transistor coupled between the output of the second operational amplifier and the first node, the fourth transistor comprising a first current electrode coupled to the first node, a second current electrode coupled to the second voltage reference, and a control electrode coupled to the output of the second operational amplifier.

17. The device of claim 1, further comprising:
a third bitcell comprising a third terminal, a current through the third terminal representative of a second reference current; and
a current mirror coupled between the second terminal of the second bitcell and the first node, the current mirror comprising a first terminal coupled to the second terminal of the second bitcell and the third terminal of the third bitcell, and a second terminal coupled to the first node, a current through the second terminal representative of an average of the first reference current and the second reference current.

18. The device of claim 17, wherein the current mirror comprises a third terminal coupled to the second input of the sense amplifier.

19. The device of claim 17, wherein the second input of the sense amplifier is configured to receive a bitline voltage associated with a bitline of the second bitcell.

20. A method, comprising:
during a first phase, coupling a first input terminal of a sense amplifier to a second input terminal of the sense amplifier;
during a second phase, decoupling the first input terminal of the sense amplifier from the second input terminal of the sense amplifier;
during the second phase, determining a difference between a first current associated with the state of a first bitcell and a second current associated with the state of a reference bitcell based on a voltage at a node coupled to the first bitcell and the reference bitcell; and
determining a state of the first bitcell based on the difference.

21. The method of claim 20, wherein the first phase substantially corresponds with a precharge phase of a bitline of the first bitcell.

* * * * *